United States Patent
Goel et al.

(10) Patent No.: US 9,390,219 B2
(45) Date of Patent: Jul. 12, 2016

(54) SYSTEM FOR AND METHOD OF SEMICONDUCTOR FAULT DETECTION

(71) Applicant: TAIWAN SEMICONDUCTOR MANUFACTURING COMPANY, LTD., Hsinchu (TW)

(72) Inventors: Sandeep Kumar Goel, Dublin, CA (US); Yuan-Han Lee, Baoshan Township (TW)

(73) Assignee: TAIWAN SEMICONDUCTOR MANUFACTURING COMPANY, LTD (TW)

( * ) Notice: Subject to any disclaimer, the term of this patent is extended or adjusted under 35 U.S.C. 154(b) by 29 days.

(21) Appl. No.: 14/291,286

(22) Filed: May 30, 2014

(65) Prior Publication Data

US 2015/0347664 A1 Dec. 3, 2015

(51) Int. Cl.
*G06F 17/50* (2006.01)
*G01R 31/3183* (2006.01)

(52) U.S. Cl.
CPC .... G06F 17/5081 (2013.01); G01R 31/318364 (2013.01); *G06F 2217/14* (2013.01)

(58) Field of Classification Search
CPC .................................................. G06F 17/5081
USPC .......................................................... 716/136
See application file for complete search history.

(56) References Cited

U.S. PATENT DOCUMENTS

2007/0113127 A1* 5/2007 Nonaka ................ G06F 17/505
714/724

* cited by examiner

*Primary Examiner* — Thuan Do
(74) *Attorney, Agent, or Firm* — Hauptman Ham, LLP (57) ABSTRACT

A method of detecting one or more faults in a semiconductor device that includes generating a first test pattern set from a primary node list and a fault list. The primary node list includes one or more nodes and the fault list identifies one or more faults. The method also includes generating one or more secondary node lists from the primary node list and generating a second test pattern set from at least the first test pattern set and the secondary node list. Each node of the one or more nodes of the primary node list is associated with a corresponding secondary node list of the one or more secondary node lists.

20 Claims, 10 Drawing Sheets

FIG. 1A

| A | B | C | D | E | F | G | H | I | FAULTS TESTED |
|---|---|---|---|---|---|---|---|---|---|
| 1 | 1 | 1 | 0 | X | X | 1 | 0 | 1 | A0, B0, C0, G0 |
| 0 | X | X | 1 | 1 | 1 | 0 | 1 | 1 | D0, E0, F0, H0 |

SYSTEM FOR AND METHOD OF SEMICONDUCTOR FAULT DETECTION

BACKGROUND

The recent trend in miniaturizing integrated circuits (ICs) has resulted in smaller devices which consume less power, yet provide more functionality at higher speeds than before. The miniaturization process has also resulted in stricter design and manufacturing specifications. Various electronic design automation (EDA) tools are developed to generate, optimize and verify designs for semiconductor devices while ensuring that the design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the design of an integrated circuit, fault testing is performed to detect one or more faults. A fault is an abnormal condition or defect in a semiconductor device. A test pattern is an ordered list of inputs and expected outputs of one or more semiconductor devices being tested for faults according to one or more fault models. In some embodiments, one or more faults are detected in a semiconductor device by applying one or more filtered test pattern sets to the semiconductor device. In some embodiments, one or more filtered test patterns are utilized to detect defects where a large defect density is observed in the semiconductor device when compared with other regions (e.g., lower defect density regions).

Figure 1A:
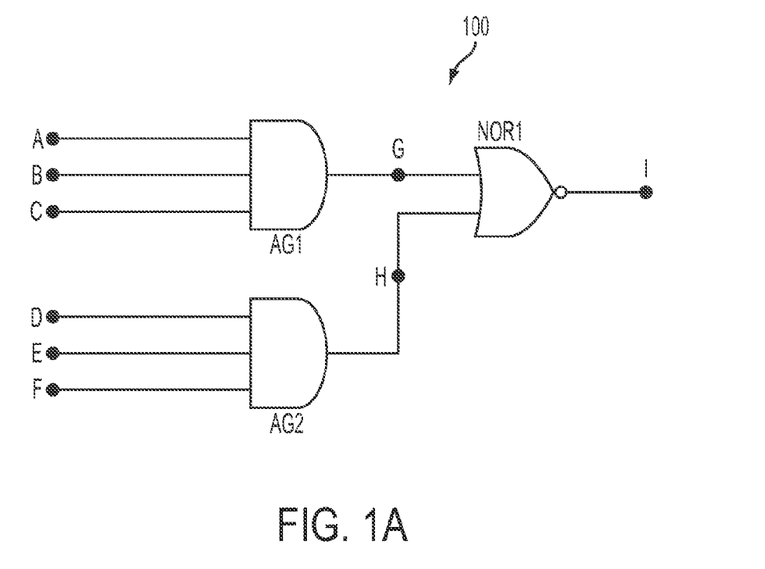
FIG. 1A is a schematic diagram of a semiconductor device in accordance with some embodiments.

FIG. 1A is a schematic diagram of a semiconductor device 100 in accordance with some embodiments. Semiconductor device 100 includes an AND gate AG1, an AND gate AG2, and a NOR gate NOR1. Semiconductor device 100 includes nodes A, B, C, D, E, F, G, H and I. A node is a portion of a circuit where two or more circuit elements meet or are connected, an output port of a circuit element or an input port of a circuit element.

AND gate AG1 is connected to NOR gate NOR1 by node G. AND gate AG1 is connected to one or more external circuit elements (not shown) by nodes A, B and C. The input of AND gate AG1 is configured to receive an input signal by nodes A, B and C. The output of AND gate AG1 is configured to send an output signal to NOR gate NOR1 by node G.

AND gate AG2 is connected to NOR gate NOR1 by node H. AND gate AG2 is connected to one or more external circuit elements (not shown) by nodes D, E and F. The input of AND gate AG2 is configured to receive an input signal by nodes D, E and F. The output of AND gate AG2 is configured to send an output signal to NOR gate NOR1 by node H.

NOR gate NOR1 is connected to an external circuit element (not shown) by node I. The output of NOR gate NOR1 is configured to send an output signal to node I.

Figure 1B:
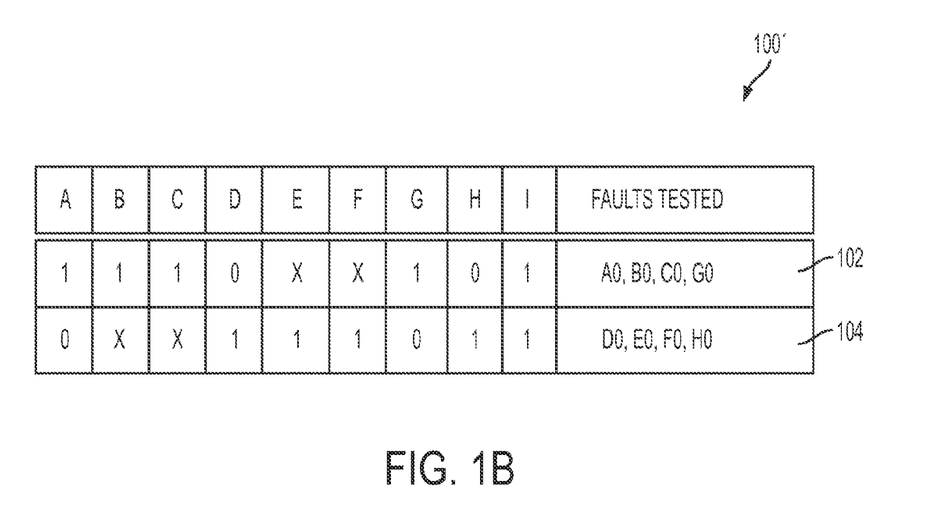
FIG. 1B is a table of one or more test patterns of a semiconductor device in accordance with some embodiments.

FIG. 1B is a table of one or more test patterns 100' of semiconductor device 100 in accordance with some embodiments. Test pattern 100' includes a first test pattern 102 and a second test pattern 104. A test pattern is an ordered list of inputs and expected outputs of one or more semiconductor devices being tested for faults according to one or more fault models. In some embodiments, a test pattern is created by an automated test pattern generator (ATPG).

A fault is an abnormal condition or defect in a semiconductor device and may affect the operation of the semiconductor device. A fault may be resistive open circuits, resistive short circuits, conductive line edge roughness or residues, high resistive contacts and vias or copper pits. Faults may be caused by process variations, power-supply noise, cross talk, and rule violations related to design for manufacturability (DfM), such as butted contacts and insufficient via enclosures.

First test pattern 102 includes an input sequence (e.g., 1 1 1 0 x x 1 0) applied to nodes A, B, C, D, E, F, G, H, an output sequence output by node I (e.g., 1) and faults tested (e.g., A0, B0, C0 and G0). In this example, first test pattern 102 is a test pattern for a stuck-at-zero fault model for circuit 100. For example, if the input sequence (e.g., 1 1 1) is applied to nodes A, B and C, then the expected output of node G is a logical high (e.g., 1). However, for a stuck-at-zero implementation, one of the input sequence entries (e.g., 1 1 1) applied to nodes A, B and C is changed to include one or more logical lows (e.g., 0). In this example, the output sequence of the AND gate AG1 is also changed to a logical low (e.g. 0). In this example, one or more faults are tested at nodes A, B, C and G (shown as A0, B0, C0 and G0) by first test pattern 102.

Second test pattern 104 includes an input sequence (e.g., 0 x x 1 1 1 0 1) applied to nodes A, B, C, D, E, F, G, H, an output sequence output by node I (e.g., 1) and faults tested (e.g., D0, E0, F0 and H0). In this example, second test pattern 104 is a test pattern for a stuck-at-zero fault model for circuit 100. For example, if the input sequence (e.g., 1 1 1) is applied to nodes D, E and F, then the expected output of node H is a logical high (e.g., 1). However, for a stuck-at-zero implementation, one of the input sequence entries (e.g., 1 1 1) applied to nodes D, E and F is changed to include one or more logical lows (e.g., 0). In this example, the output sequence of the AND gate AG2 is also changed to a logical low (e.g. 0). In this example, one or more faults are tested at nodes D, E, F and H (shown as D0, E0, F0 and H0) by second test pattern 104.

Figure 2:
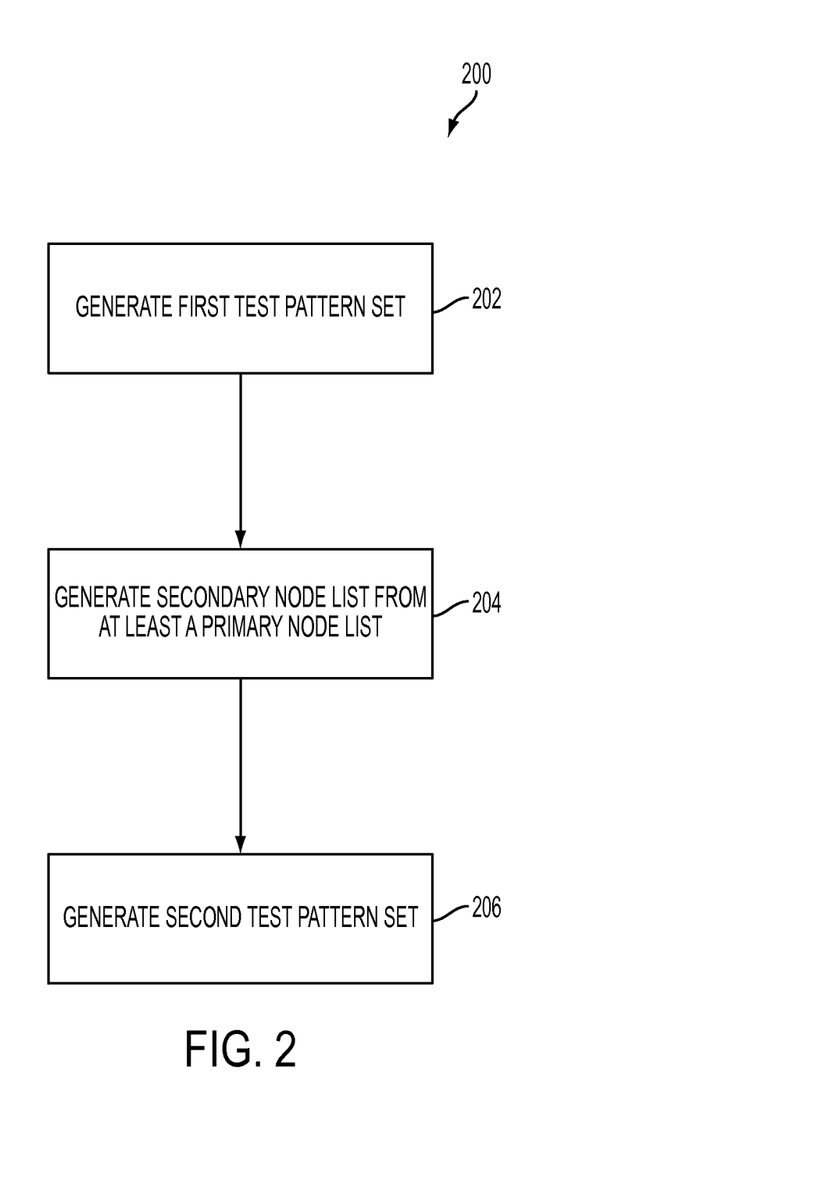
FIG. 2 is a flow chart of a method of detecting one or more faults in a semiconductor device in accordance with some embodiments

FIG. 2 is a flow chart of a method 200 of detecting one or more faults in a semiconductor device in accordance with some embodiments. In some embodiments, the method 200 is implemented as a software application including computer program code for execution by a processor that is used by an EDA tool. Method 200 begins with operation 202 in which a system for detecting faults in a semiconductor device generates a first test pattern set. The first test pattern set includes one or more test patterns. In some embodiments, the first test pattern set is generated from a primary node list and a fault list. The primary node list includes one or more nodes. The fault list includes one or more faults. Each test pattern of the one or more test patterns is arranged to cause the detection of at least one fault from the fault list. In some embodiments, the primary node list is derived from one or more netlists. In some embodiments, a netlist includes node information of a semiconductor device. In some embodiments, a netlist includes a voltage, a current or node information of a semiconductor device.

A fault list is a list of one or more faults generated by a particular fault model when the model is applied to one or more of the nodes in a semiconductor device being tested. In some embodiments, the fault list includes coordinate data of a physical layout that is associated with one or more faults.

Fault models are utilized to test different types of defects in a semiconductor device. In some embodiments, a fault model includes a line stuck-at fault model, transition fault model, bridging fault model, path delay fault model, and other similar models.

In operation 204, the system for detecting faults in a semiconductor device generates one or more secondary node lists from at least the primary node list. In some embodiments, each secondary node list includes a node selected from the primary node list. In some embodiments, each secondary node list includes one or more nodes from the primary node list within a predetermined distance of the selected node. In some embodiments, each node of the one or more nodes in the primary node list is associated with a corresponding secondary node list of the one or more secondary node lists. In some embodiments, each secondary node list is a neighbor node list including one or more adjacent nodes in the primary node list. In some embodiments, an adjacent node is a node within a predetermined distance of other nodes in the primary node list.

In operation 206, the system for detecting faults in a semiconductor device generates a second test pattern set from at least the first test pattern set and the secondary node list. The second test pattern set is a portion of the first test pattern set. In some embodiments, the second test pattern set is a filtered version of the first test pattern set. In some embodiments, the second test pattern set includes one or more filtered test patterns. Each filtered test pattern of the one or more filtered test patterns is arranged to cause the detection of at least one fault from the fault list. In some embodiments, the number of entries in the second test pattern set is less than the number of entries in the first test pattern set. In some embodiments, the number of entries in the second test pattern set is substantially equal to the number of entries in the first test pattern set. In some embodiments, each test pattern of the one or more test patterns includes one or more ordered lists of inputs to the semiconductor device and one or more ordered lists of expected outputs of the semiconductor device, wherein each ordered list of inputs of the one or more ordered lists of inputs corresponds to each ordered list of expected outputs of the one or more ordered lists of expected outputs.

The second test pattern set includes one or more test patterns based on the secondary node list. In some embodiments, the second test pattern set includes one or more test patterns that detect faults where a large defect density is observed in the semiconductor device when compared with other regions (e.g., lower defect density regions). In some embodiments, the second test pattern set targets regions of the semiconductor device where clustered defects are observed in neighbor nodes. In some embodiments, the second test pattern set includes one or more test patterns based on neighborhood excitation and propagation. In some embodiments, the second test pattern set is correlated to one or more test patterns based on the neighbor nodes contained in each neighbor node list.

Figure 3A:
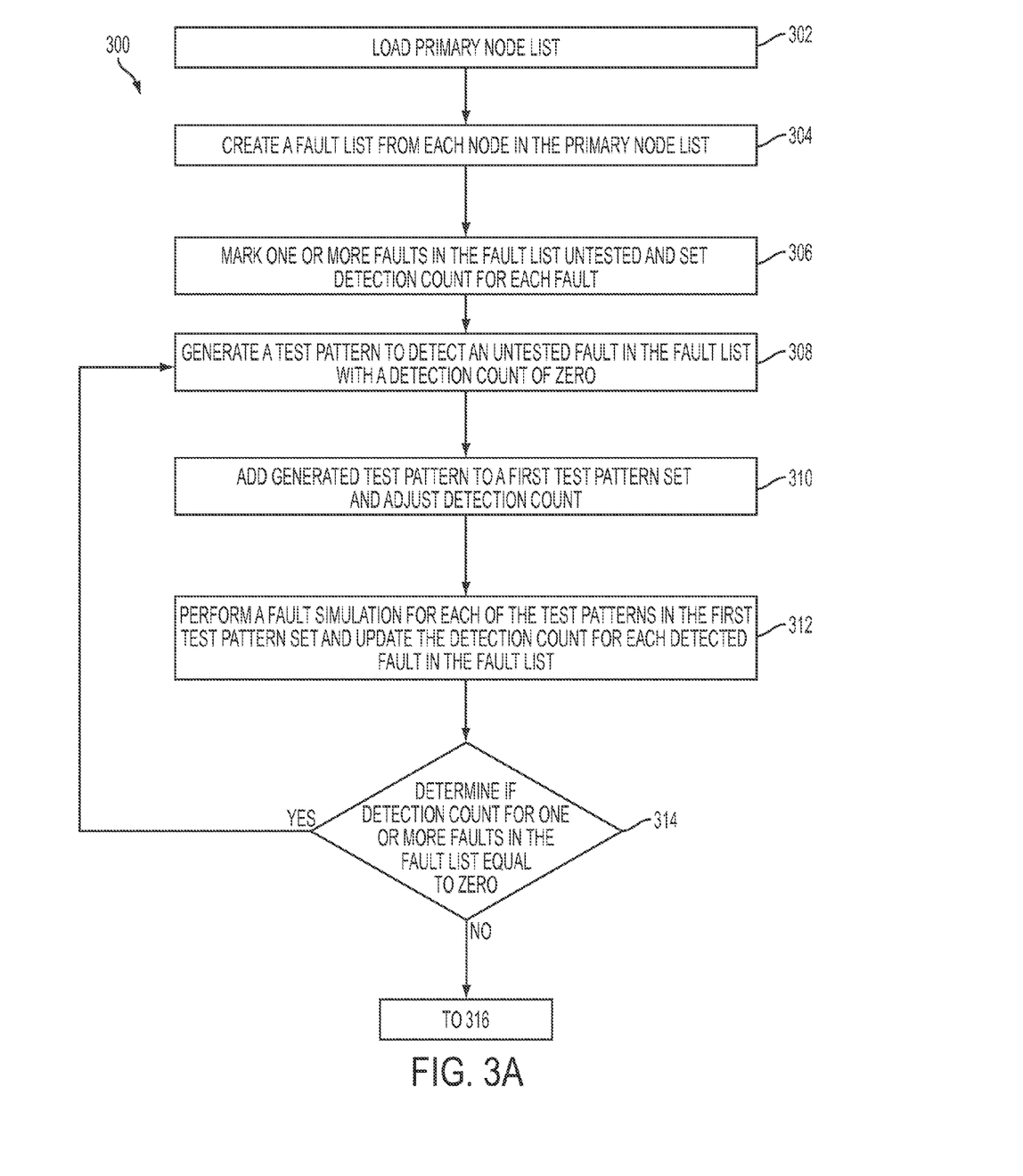
FIG. 3A is a flow chart of a method of generating a first test pattern set in a semiconductor device in accordance with some embodiments.
Figure 3B:
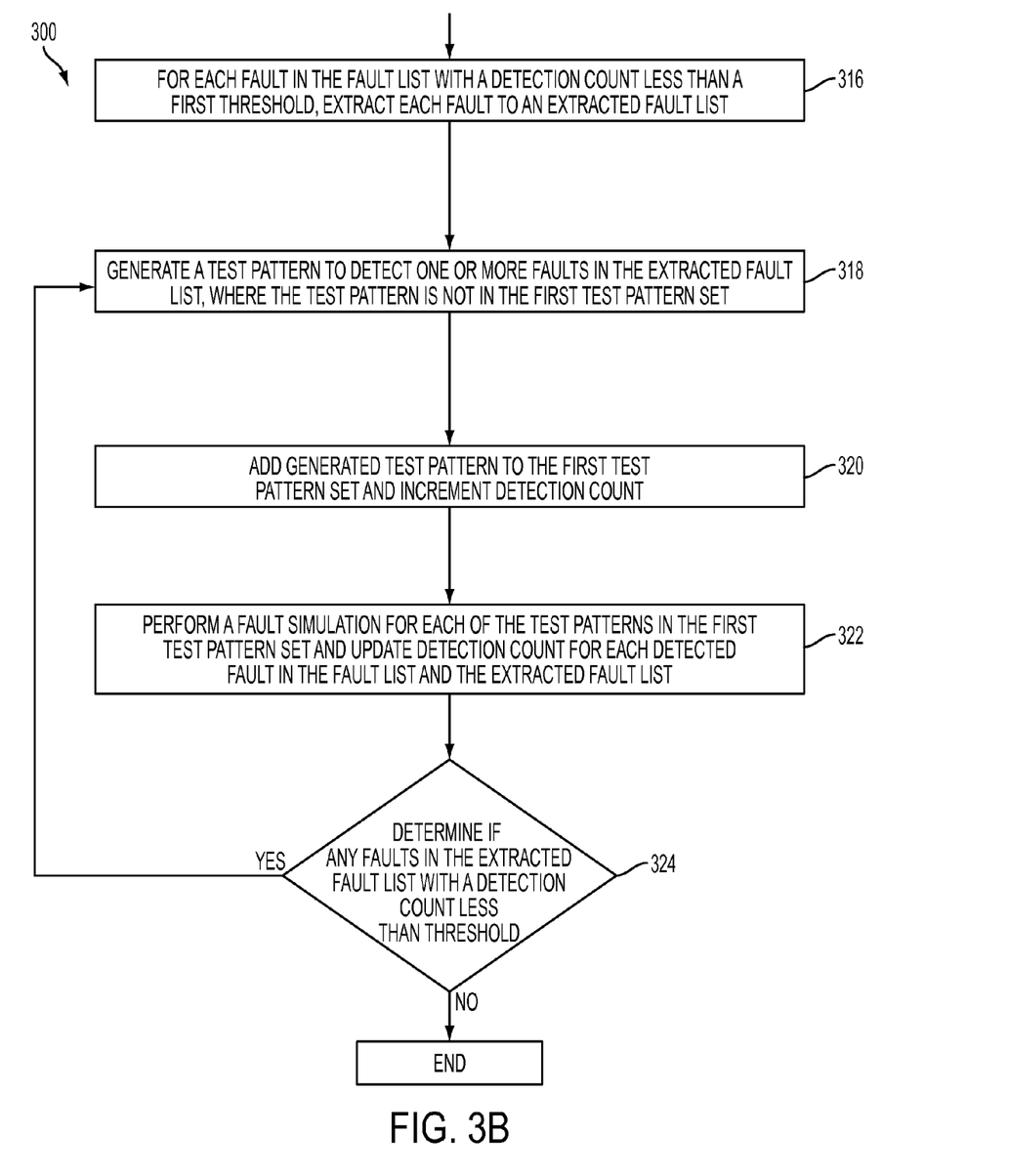
FIG. 3B is a flow chart of a method of generating a first test pattern set in a semiconductor device in accordance with some embodiments.

FIGS. 3A-3B are a flow chart of a method 300 of generating a first test pattern set in a semiconductor device in accordance with some embodiments. Method 300 is an embodiment of operation 202 shown in FIG. 2. Method 300 begins with operation 302 in which a primary node list is loaded into a fault detection tool. In some embodiments, the fault detection tool is computer program code in a portion of an EDA tool.

In operation 304, the system for detecting faults in a semiconductor device creates a fault list from the primary node list. In some embodiments, the fault list is created from each node in the primary node list.

In operation 306, the system for detecting faults in a semiconductor device marks one or more of the faults in the fault list as untested and sets a detection count for each corresponding fault in the fault list. In some embodiments, the system for detecting faults in a semiconductor device marks each fault in the fault list as untested. In some embodiments, the system for detecting faults marks each fault as undetected. The detection count corresponds to the number of times a fault is detected for each corresponding fault member in the fault list. Each fault member of the fault list is associated with a corresponding detection count. In this exemplary implementation, the detection count for each corresponding fault in the fault list is set equal to zero.

In operation 308, the system for detecting faults in a semiconductor device generates a test pattern to detect an untested fault that has a detection count of zero. The system for detecting faults in a semiconductor device generates a test pattern by the use of an automatic test pattern generator (ATPG). In some embodiments, a test pattern is not generated which detects the corresponding fault. In these embodiments, operation 308 is repeated a number of times in order to generate a test pattern which detects the corresponding fault. In some embodiments, the number of times operation 308 is repeated is based on a default value set by the system for detecting faults. In some embodiments, if the number of times operation 308 is repeated exceeds the default value, then operation 308 marks the corresponding fault as "untestable." By marking the undetected fault as "untestable," the possibility of an infinite loop is avoided in operation 314.

In operation 310, the system for detecting faults in a semiconductor device adds the generated test pattern to a first test pattern set and adjusts the detection count for the corresponding fault as tested. The detection count is adjusted by incrementing the detection count by an integer, for example, 1. For the faults marked as "untestable", the corresponding detection count is not adjusted, no test pattern is added to the first test pattern set, and the operation proceeds to operation 312.

In some embodiments, operations 308 and 310 repeats until the number of test patterns in the first test pattern set correspond to a predetermined number of test patterns. In some embodiments, operations 308 and 310 repeats until the number of test patterns in the first test pattern set are equal to 32 or 64.

In operation 312, the system for detecting faults in a semiconductor device performs a fault simulation for each of the test patterns in the first test pattern set and updates the detection count for each detected fault in the fault list. A fault simulation includes the utilization of one or more fault models to test one or more defect types in a semiconductor device. In some embodiments, a fault model includes a line stuck-at fault model, transition fault model, bridging fault model, path delay fault model, and similar models. In some embodiments, after performing the fault simulation for each of the test patterns in the first test pattern set, the detection count for each additionally detected fault in the fault list is updated and the detection count for previously detected faults is not updated.

In operation 314, the system for detecting faults in a semiconductor device determines if the detection count for one or more corresponding faults in the fault list is equal to zero. If the system for detecting faults in a semiconductor device determines that the detection count for one or more corresponding faults in the fault list is equal to zero, the operation proceeds to 308. If the system for detecting faults in a semiconductor device determines that the detection count for no faults in the fault list is equal to zero, the operation proceeds to 316. In some embodiments, if the system for detecting faults in a semiconductor device determines that the detection count for one or more corresponding faults in the fault list is equal to zero then the one or more tests in the first test pattern set did not detect one or more faults during fault simulation. Returning to operation 308, an untested fault in the fault list having a detection count of zero is selected and operations 308, 310 and 312 repeats. In some embodiments, for operation 314, the system for detecting faults in a semiconductor device determines if the detection count for one or more corresponding faults in the fault list (that are not marked as "untestable") is equal to zero. If the system for detecting faults in a semiconductor device determines that the detection count for one or more corresponding faults (that are not marked as "untestable") is equal to zero, the operation proceeds to 308. If the system for detecting faults in a semiconductor device determines that the detection count for no faults in the fault list (that are not marked as "untestable") is equal to zero, the operation proceeds to 316.

In operation 316, the system for detecting faults in a semiconductor device extracts one or more faults in the fault list to an extracted fault list. In some embodiments, each fault in the fault list with a corresponding detection count less than a first threshold is extracted to the extracted fault list. In some embodiments, the first threshold is a positive integer which ranges from about 1 to about 16, Each fault in the fault list with a corresponding detection count greater than a first threshold is extracted to the extracted fault list.

In operation 318, the system for detecting faults in a semiconductor device generates a test pattern not already in the first test pattern set to detect one or more faults in the extracted fault list. In some embodiments, a test pattern is not generated which detects the corresponding fault. In these embodiments, operation 318 is repeated a number of times in order to generate a test pattern which detects the corresponding fault. In some embodiments, the number of times operation 318 is repeated is based on a default value set by the system for detecting faults. In some embodiments, if the number of times operation 318 is repeated exceeds the default value, then operation 318 marks the corresponding fault as "untestable." By marking the undetected fault as "untestable," the possibility of an infinite loop is avoided in operation 324.

In operation 320, the system for detecting faults in a semiconductor device adds the generated test pattern to the first test pattern set and adjusts the detection count for the corresponding fault as tested. The detection count is adjusted by incrementing the detection count by an integer, for example, 1. For the faults marked as "untestable", the corresponding detection count is not adjusted, no test pattern is added to the first test pattern set, and the operation proceeds to operation 322.

In some embodiments, operations 318 and 320 repeats until a number of test patterns are generated. In some embodiments, operations 318 and 320 repeats until the number of test patterns in the first test pattern set correspond to a predetermined number of test patterns. In some embodiments, operations 318 and 320 repeats until the number of test patterns in the first test pattern set are equal to 32 or 64.

In operation 322, the system for detecting faults in a semiconductor device performs a fault simulation for each of the test patterns in the first test pattern set and updates the detection count for each detected fault in the corresponding fault list and the corresponding extracted fault list. In some embodiments, after performing the fault simulation for each of the test patterns in the first test pattern set, the detection count for each additionally detected fault in the fault list and the extracted fault list are updated and the detection count for previously detected faults is not updated.

In operation 324, the system for detecting faults in a semiconductor device determines if the detection count for one or more corresponding faults in the extracted fault list is less than the first threshold. If the system for detecting faults in a semiconductor device determines the detection count for one or more corresponding faults in the extracted fault list is less than the first threshold, the operation proceeds to operation 318. If the system for detecting faults in a semiconductor device determines the detection count for no corresponding faults in the extracted fault list is less than the first threshold, the operation ends. In some embodiments, method 300 incorporates an N-detection testing model. In some embodiments, for operation 324, the system for detecting faults in a semiconductor device determines if the detection count for one or more corresponding faults in the extracted fault list (that are not marked as "untestable") is less than the first threshold. If the system for detecting faults in a semiconductor device determines that the detection count for one or more corresponding faults in the extracted fault list (that are not marked as "untestable") is less than the first threshold, the operation proceeds to 318. If the system for detecting faults in a semiconductor device determines that the detection count for no corresponding faults in the extracted fault list (that are not marked as "untestable") is less than the first threshold, the operation ends.

Although operations 308 and 314 are exemplified where marking each fault as undetected corresponds to initializing the detection count for each corresponding fault in the fault list is equal to zero, alternative embodiments exist where marking the fault as untested corresponds to initializing the detection count for each corresponding fault in the fault list is equal to a non-zero integer. In these embodiments, for operation 314, the system for detecting faults in a semiconductor device determines if the detection count for each corresponding fault in the fault list is equal to the initialized, non-zero integer. In some embodiments, if the system for detecting faults in a semiconductor device determines that the detection count for one or more corresponding faults in the fault list is equal to the initialized, non-zero value, the operation proceeds to 308. In some embodiments, if the system for detecting faults in a semiconductor device determines that the detection count for no faults in the fault list is equal to the initialized, non-zero value, the operation proceeds to 316. In this example, if the system for detecting faults in a semiconductor device determines that the detection count for one or more corresponding faults in the fault list is equal to the initialized, non-zero integer, then the one or more tests in the first test pattern set did not detect one or more faults during fault simulation.

Although operations 310 and 320 are exemplified where the detection count is adjusted by incrementing the detection count by an integer, other embodiments exist where the detection count is adjusted by decrementing the detection count by an integer, e.g., 1, and operations 316 and 324 are implemented with a second threshold. In these embodiments, for operation 316, the system for detecting faults in a semiconductor device extracts each fault in the fault list with a corresponding detection count greater than a second threshold to the extracted fault list. In some embodiments, the second threshold is a negative integer which ranges from about −16 to about −1. In some embodiments, the second threshold is entered by a user. In these embodiments, for operation 324, the system for detecting faults in a semiconductor device determines if the detection count for one or more corresponding faults in the extracted fault list is greater than the second threshold. In some embodiments, if the system for detecting faults in a semiconductor device determines the detection count for one or more corresponding faults in the extracted fault list is greater than the second threshold, the operation proceeds to operation 318. In some embodiments, if the system for detecting faults in a semiconductor device determines the detection count for no corresponding faults in the extracted fault list is greater than the second threshold, the operation ends.

Figure 4:
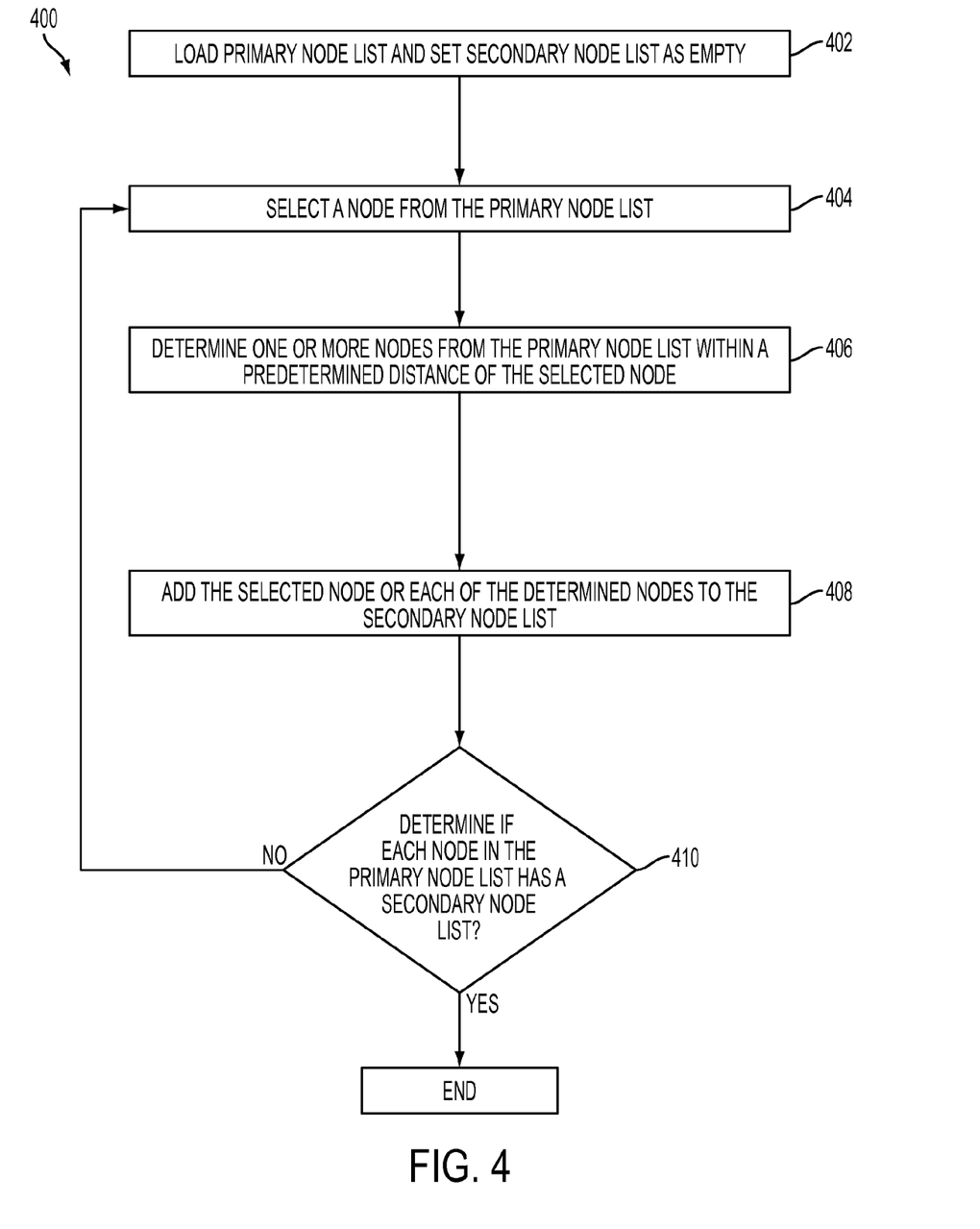
FIG. 4 is a flow chart of a method of generating a secondary node list in a semiconductor device in accordance with some embodiments.

FIG. 4 is a flow chart of a method 400 of generating a secondary node list in a semiconductor device in accordance with some embodiments. Method 400 is an embodiment of operation 204 shown in FIG. 2. Method 400 begins with operation 402 in which a primary node list is loaded into a fault detection tool and sets the secondary node list for each of the nodes in the primary node list. In some embodiments, the fault detection tool is computer program code in a portion of an EDA tool. In some embodiments, the secondary node list for each of the nodes in the primary node list is equal to an empty set. In some embodiments, the secondary node list for each of the nodes in the primary node list includes one or more data values that are configured to be overwritten.

In operation 404, the system for detecting faults in a semiconductor device selects a node from the primary node list. A node from the primary node list with an empty secondary node list is selected.

Figure 5A:
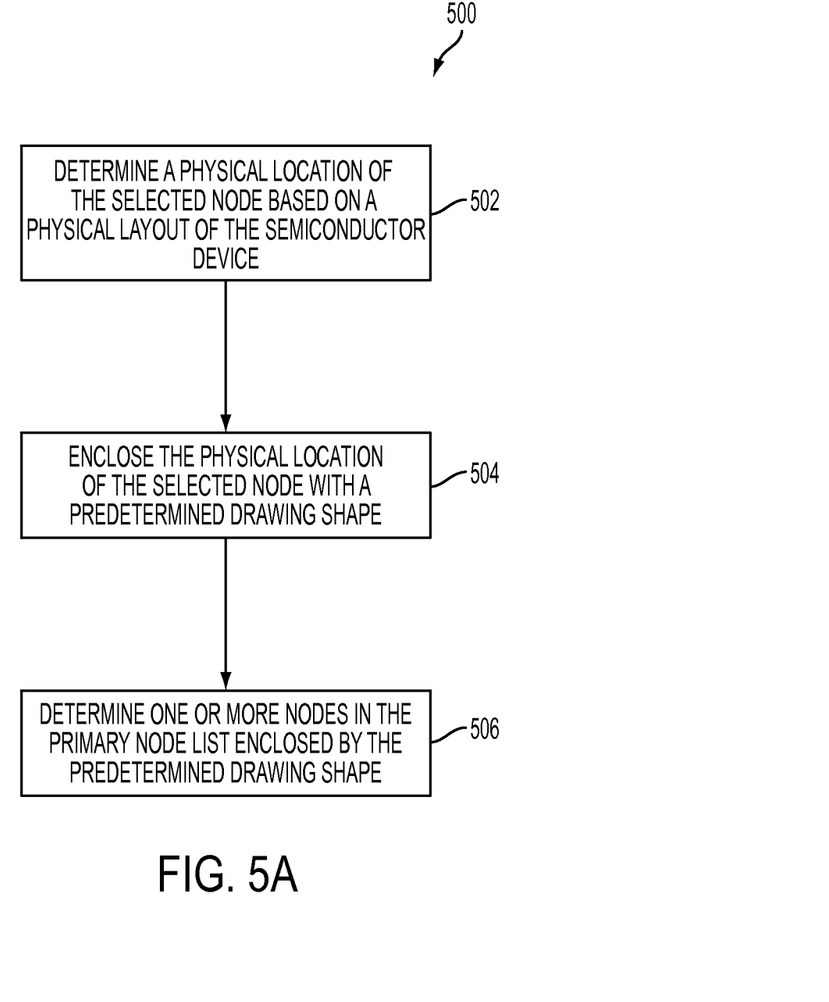
FIG. 5A is a flow chart of a method of determining one or more nodes in the primary node list within a predetermined distance of the selected node in a semiconductor device in accordance with some embodiments.

In operation 406, the system for detecting faults in a semiconductor device determines one or more nodes from the primary node list within a predetermined distance of the selected node. The predetermined distance is a physical distance. In some embodiments, the predetermined distance is entered by a user. In some embodiments, the predetermined distance is adjusted by a user. In some embodiments, the one or more determined nodes from the primary node list within a predetermined distance of the selected node correspond to neighbors of the selected node. In some embodiments, the predetermined distance is bounded by the corresponding predetermined drawing shape of method 500.

In operation 408, the system for detecting faults in a semiconductor device adds the selected node or each of the determined nodes of the primary node list (within a predetermined distance of the selected node) to the secondary node list for the corresponding selected node. In some embodiments, the system for detecting faults in a semiconductor device adds the selected node and the corresponding neighbor nodes to the secondary node list for the corresponding selected node.

In operation 410, the system for detecting faults in a semiconductor device determines if each node in the primary node list has a corresponding secondary node list. If the system for detecting faults in a semiconductor device determines that each node in the primary node list does not have a corresponding secondary node list, the operation proceeds to operation 404. If the system for detecting faults in a semiconductor device determines each of the nodes in the primary node list has a corresponding secondary node list, the operation ends.

In operation 410, determining if each node in the primary node list has a corresponding secondary node list includes determining if one or more secondary node lists includes an empty set. If the system for detecting faults in a semiconductor device determines that one or more secondary node lists include an empty set, the operation proceeds to operation 404. If the system for detecting faults in a semiconductor device determines that each of the secondary node lists do not have an empty set, the operation ends.

FIG. 5A is a flow chart of a method 500 of determining one or more nodes in the primary node list within a predetermined distance of the selected node in a semiconductor device in accordance with some embodiments. Method 500 is an embodiment of operation 406 shown in FIG. 4. Method 500 begins with operation 502 in which the system for detecting faults in a semiconductor device determines a physical location of the selected node based on a physical layout of the semiconductor device.

The physical location of the selected node is the corresponding coordinates of the selected node based on the physical layout. In some embodiments, the physical layout is generated by an EDA tool. In some embodiments, the physical layout is generated by a fault detection tool. In some embodiments, the EDA tool which generates the physical layout is the same EDA tool which implements methods 200, 300, 400 or 500. In some embodiments, the EDA tool which generates the physical layout is different from the EDA tool which implements methods 200, 300, 400 or 500.

In operation 504, the system for detecting faults in a semiconductor device encloses the physical location of the selected node with a predetermined drawing shape. In some embodiments, the predetermined drawing shape is a polygon. In some embodiments, the predetermined drawing shape is a rectangle. In some embodiments, the predetermined drawing shape is a square. In some embodiments, the predetermined drawing shape is a circle. In some embodiments, the predetermined drawing shape is an ellipse. In some embodiments, a size of the predetermined drawing shape is adjusted. In some embodiments, a size of the predetermined drawing shape is fixed. In some embodiments, a shape of the predetermined drawing shape is adjusted. In some embodiments, a shape of the predetermined drawing shape is fixed.

In operation 506, the system for detecting faults in a semiconductor device determines one or more nodes in the primary node list enclosed by the predetermined drawing shape. In some embodiments, the one or more nodes in the primary node list enclosed by the predetermined drawing shape include the selected node and the corresponding neighbor nodes. In some embodiments, the one or more nodes in the primary node list enclosed by the predetermined drawing shape include the secondary node list associated with the selected node. In some embodiments, if the predetermined drawing shape intersects a physical coordinate location of a node, then the intersecting node is included in the secondary node list. In some embodiments, if the predetermined drawing shape intersects the physical coordinate location of a node, then the intersecting node is not included in the secondary node list.

Figure 5B:
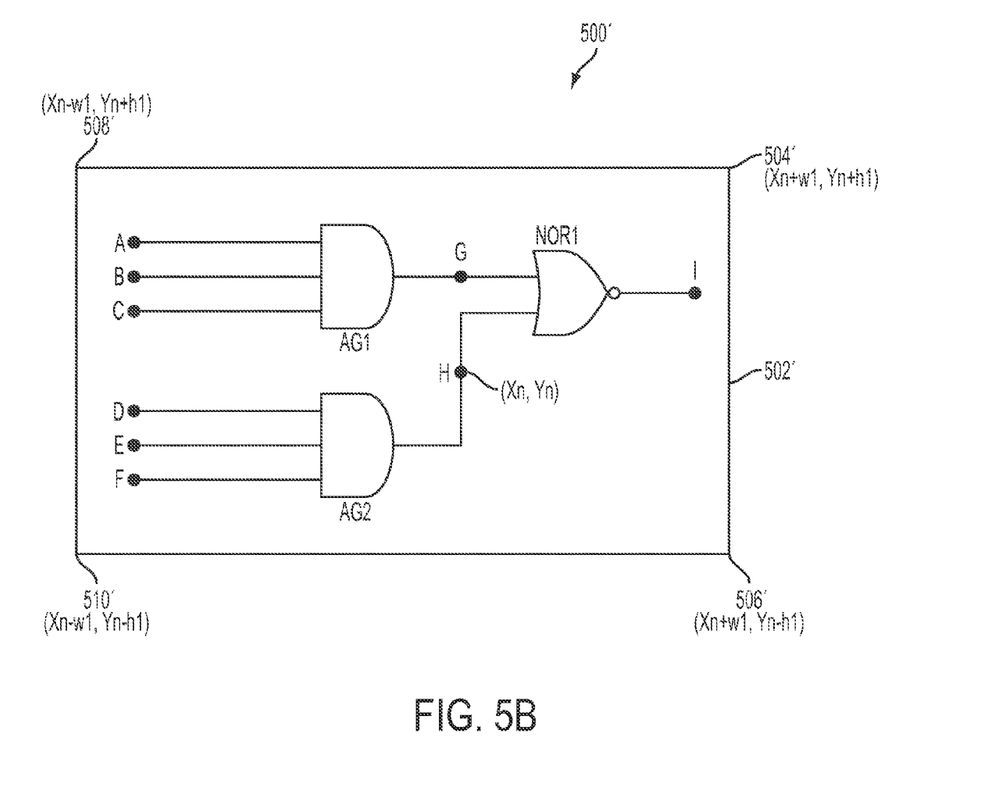
FIG. 5B is a schematic diagram of a semiconductor device in accordance with some embodiments.

FIG. 5B is a schematic diagram of a semiconductor device, e.g., semiconductor device 500', after execution of method 500 in accordance with some embodiments. Semiconductor device 500' is an embodiment of the semiconductor device 100 shown in FIG. 1A. In comparison with FIG. 1A, FIG. 5B also includes predetermined drawing shape 502'.

Predetermined drawing shape 502' is bounded by coordinate locations 504', 506', 508' and 510'. In some embodiments, the center of the predetermined drawing shape 502' corresponds to the physical location of node H (e.g., Xn, Yn). In some embodiments, the physical location of node H (e.g., Xn, Yn) corresponds to any region within the predetermined drawing shape 502'.

Coordinate location 504' has a physical location of Xn+w1, Yn+h1, where w1 is the half-width of predetermined drawing shape 502' and h1 is a half-height of predetermined drawing shape 502'. Coordinate location 506' has a physical location of Xn+w1, Yn−h1, where w1 is the half-width of predetermined drawing shape 502' and h1 is a half-height of predetermined drawing shape 502'. Coordinate location 508' has a physical location of Xn−w1, Yn+h1, where w1 is the half-width of predetermined drawing shape 502' and h1 is a half-height of predetermined drawing shape 502'. Coordinate location 510' has a physical location of Xn−w1, Yn−h1, where w1 is the half-width of predetermined drawing shape 502' and h1 is a half-height of predetermined drawing shape 502'.

The width w of the predetermined drawing shape 502' can be expressed by formula 1 and the height h of the predetermined drawing shape 502' can be expressed by formula 2:

$$w = 2*w1 \quad (1)$$

$$h = 2*h1 \quad (2)$$

where w is the width of the predetermined drawing shape 502', h is the height of the predetermined drawing shape 502', w1 is the half-width of the predetermined drawing shape 502' and h1 is the half-height of the predetermined drawing shape 502'.

In some embodiments, formulas 1 or 2 are expressed in Cartesian coordinates (as shown in formulas 1 and 2). In some embodiments, formulas 1 or 2 are expressed in other coordinate systems such cylindrical and spherical. In some embodiments, the width of the predetermined drawing shape 502' is substantially equal to the height of the predetermined drawing shape 502'. In some embodiments, the width of the predetermined drawing shape 502' is not equal to the height of the predetermined drawing shape 502'.

Predetermined drawing shape 502' encloses AND gate AG1, AND gate AG2 and NOR gate NOR1. Predetermined drawing shape 502' encloses nodes A, B, C, D, E, F, G, H and I. In this example, the secondary node list includes each of the nodes enclosed by the predetermined drawing shape 502' (e.g., nodes A, B, C, D, E, F, G, H and I). In this example, node H is a primary node and nodes A, B, C, D, E, F, G and I are secondary nodes (e.g., neighbor nodes). In this example, the secondary node list of the primary node (e.g., node H) includes nodes A, B, C, D, E, F, G, H and I.

Figure 6:
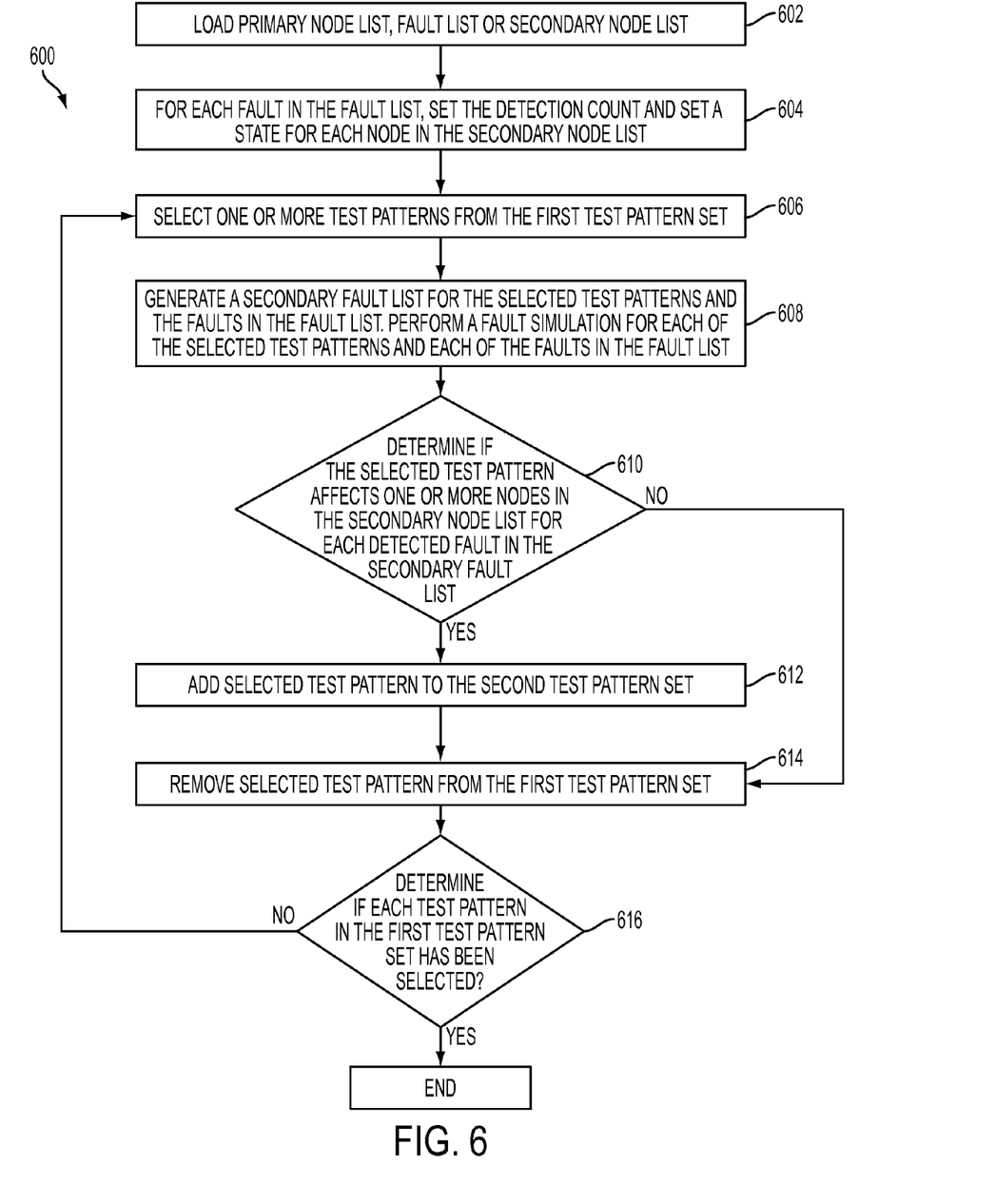
FIG. 6 is a flow chart of a method of generating a second test pattern set in a semiconductor device in accordance with some embodiments.

FIG. 6 is a flow chart of a method 600 of generating a second test pattern set in a semiconductor device in accordance with some embodiments. Method 600 is an embodiment of operation 206 shown in FIG. 2. Method 600 begins with operation 602 in which a primary node list, a fault list or a secondary node list are loaded into a fault detection tool. In some embodiments, the fault detection tool is computer program code in a portion of an EDA tool.

In operation 604, the system for detecting faults in a semiconductor device sets a detection count for each fault in the fault list and sets a state for each corresponding node in the secondary node list. The state for each corresponding node in the secondary node list corresponds to a logical state of each corresponding node in the secondary node list. The state for each corresponding node in the secondary node list corresponds to a logical high or logical low. The state for each corresponding node in the secondary node list is set as an empty set.

In operation 606, the system for detecting faults in a semiconductor device selects one or more test patterns from the first test pattern set.

In operation 608, the system for detecting faults in a semiconductor device generates a secondary fault list for each of the corresponding selected test patterns and each of the faults in the fault list. The secondary fault list includes one or more detected faults in the semiconductor device. In operation 608, generating a secondary fault list for each of the selected test patterns and each of the faults in the fault list includes performing a fault simulation for each of the selected test patterns and each of the faults in the fault list.

In operation 610, the system for detecting faults in a semiconductor device determines if the selected test patterns affect one or more nodes in the secondary node list for each detected fault in the secondary fault list. In some embodiments, affecting one or more nodes in the secondary node list includes changing a state for each corresponding node in the secondary node list. If the system for detecting faults in a semiconductor device determines the selected test patterns affect one or more nodes in the secondary node list for each detected fault in the secondary fault list, the operation proceeds to operation 612. If the system for detecting faults in a semiconductor device determines the selected test patterns did not affect one or more nodes in the secondary node list for each detected fault in the secondary fault list, the operation proceeds to operation 614.

In operation 612, the system for detecting faults in a semiconductor device adds the selected test patterns to the second test pattern set. In some embodiments, a selected test pattern added to the second test pattern set from operation 612 is a test pattern that detects faults where a large defect density is observed in the semiconductor device when compared with other regions (e.g., lower defect density regions).

In operation 614, the system for detecting faults in a semiconductor device removes the selected test patterns from the first test pattern set.

In operation 616, the system for detecting faults in a semiconductor device determines if each test pattern in the first test pattern set has been selected. If the system for detecting faults in a semiconductor device determines that each test pattern in the first test pattern set has not been selected, the operation proceeds to operation 606. If the system for detecting faults in a semiconductor device determines that each test pattern in the first test pattern set has been selected, the operation ends. In some embodiments, determining if each test pattern in the first test pattern set has been selected for operation 616 includes determining if the first test pattern set is an empty set. In some embodiments, determining if each test pattern in the first test pattern set has been selected for operation 616 includes determining if any test patterns remain in the first test pattern set.

Figure 7:
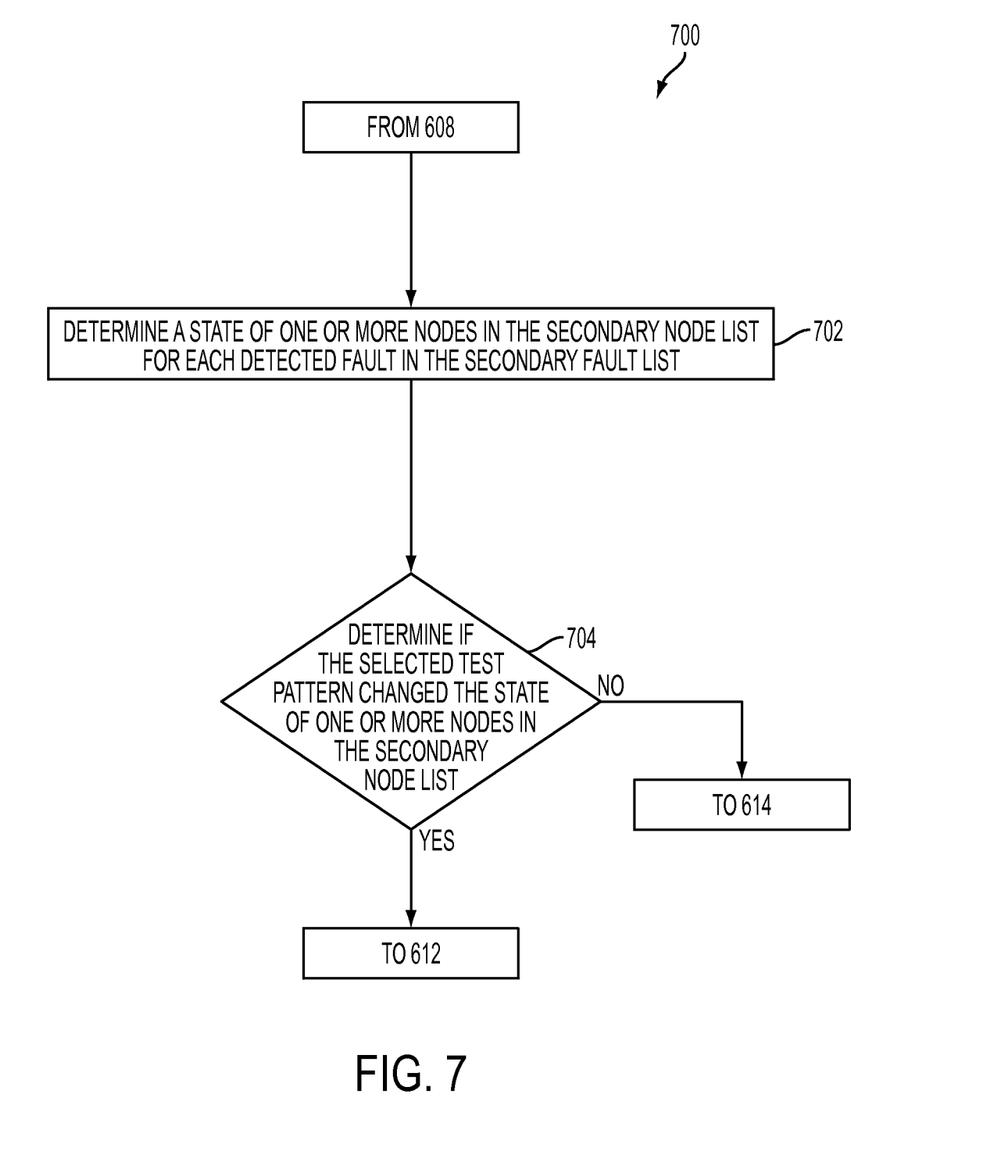
FIG. 7 is a flow chart of a method of determining if the selected test patterns affect one or more nodes in the secondary node list in a semiconductor device in accordance with some embodiments.

FIG. 7 is a flow chart of a method 700 of determining if the selected test patterns affect one or more nodes in the secondary node list in a semiconductor device in accordance with some embodiments. Method 700 is an embodiment of operation 610 shown in FIG. 6. Method 700 begins with operation 702 in which the system for detecting faults in a semiconductor device determines a state of one or more nodes in the secondary node list for each corresponding detected fault in the secondary fault list.

In operation 704, the system for detecting faults in a semiconductor device determines if the selected test pattern changed the state of one or more nodes in the secondary node list for each detected fault in the secondary fault list. If the system for detecting faults in a semiconductor device determines the selected test patterns changed the state of one or more nodes in the secondary node list for each detected fault in the secondary fault list, the operation proceeds to operation 612 (shown in FIG. 6). If the system for detecting faults in a semiconductor device determines the selected test patterns did not change the state of one or more nodes in the secondary node list for each detected fault in the secondary fault list, the operation proceeds to operation 614 (shown in FIG. 6). In some embodiments, method 700 is repeated for each detected fault in the secondary fault list.

Figure 8:
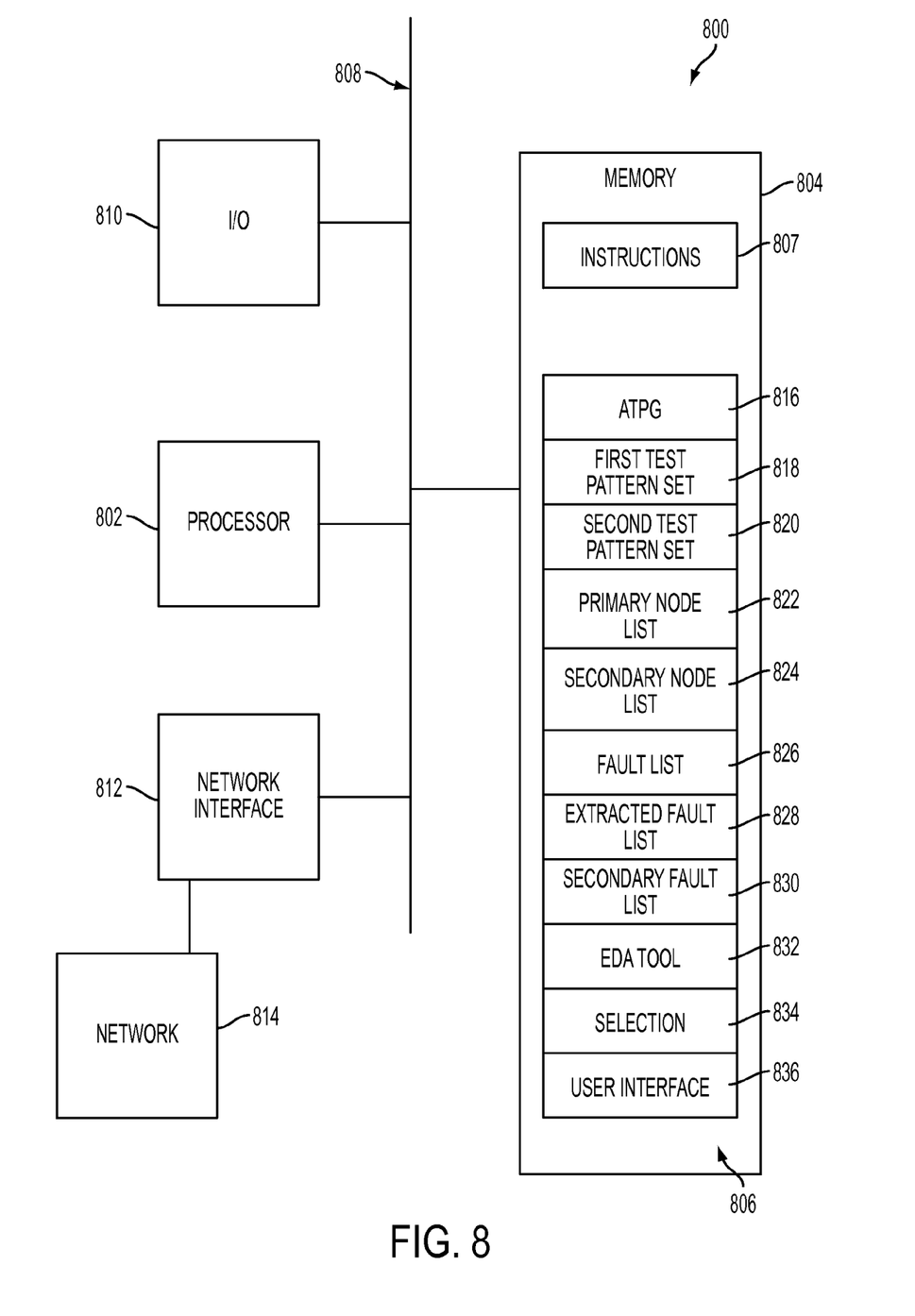
FIG. 8 is a block diagram of a control system for detecting faults in a semiconductor device in accordance with one or more embodiments.

FIG. 8 is a block diagram of a control system 800 for detecting faults in a semiconductor device in accordance with one or more embodiments. In some embodiments, the control system 800 is a general purpose computing device which implements method 200 of FIG. 2, method 300 of FIGS. 3A-3B, method 400 of FIG. 4, method 500 of FIG. 5A, method 600 of FIG. 6 or method 700 of FIG. 7 in accordance with one or more embodiments. Control system 800 includes a hardware processor 802 and a non-transitory, computer readable storage medium 804 encoded with, i.e., storing, the computer program code 806, i.e., a set of executable instructions. Computer readable storage medium 804 is also encoded with instructions 807 for interfacing with manufacturing machines for producing the semiconductor device. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 encoded in the computer readable storage medium 804 in order to cause system 800 to be usable for performing a portion or all of the operations as described e.g., in method 200, 300, 400, 500, 600 or 700.

In one or more embodiments, the processor 802 is a central processing unit (CPU), a multi-processor, a distributed processing system, an application specific integrated circuit (ASIC), and/or a suitable processing unit.

In one or more embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium 804 includes a compact disk-read only memory (CD-ROM), a compact disk-read/write (CD-R/W), and/or a digital video disc (DVD).

In one or more embodiments, the storage medium 804 stores the computer program code 806 configured to cause system 800 to perform method 200, 300, 400, 500, 600 or 700. In one or more embodiments, the storage medium 804 also stores information needed for performing method 200, 300, 400, 500, 600 or 700 as well as information generated during performing method 200, 300, 400, 500, 600 or 700, such as automatic test pattern generator (ATPG) 816, first test pattern set 818, second test pattern set 820, primary node list 822, secondary node list 824, fault list 826, extracted fault list 828, second fault list 830, EDA Tool 832, selection 834, user interface (UI) 836 and/or a set of executable instructions to perform the operation of method 200, 300, 400, 500, 600 or 700. In some embodiments, UI 836 is a graphical user interface (GUI).

In one or more embodiments, the storage medium 804 stores instructions 807 for interfacing with external machines. The instructions 807 enable processor 802 to generate instructions readable by the external machines to effectively implement method 200, 300, 400, 500, 600 or 700 during a design process. In some embodiments, the design process is of a semiconductor device including one or more circuit elements. In some embodiments, the design process includes a fault testing process. The instructions 807 enable processor 802 to generate instructions readable by the external machines to effectively implement method 200, 300, 400, 500, 600 or 700 during a fault testing process.

Control system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

Control system 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1394. In one or more embodiments, method 200, 300, 400, 500, 600 or 700 are implemented in two or more systems 800, and information such as ATPG 816, first test pattern set 818, second test pattern set 820, primary node list 822, secondary node list 824, fault list 826, extracted fault list 828, second fault list 830, EDA Tool 832, selection 834, UI 836 are exchanged between different systems 800 via network 814.

System 800 is configured to receive information related to an ATPG through I/O interface 810. The information is transferred to processor 802 via bus 808 to generate ATPG. The ATPG is then stored in computer readable medium 804 as ATPG 816. Control system 800 is configured to receive information related to a first test pattern set through I/O interface 810. The information is stored in computer readable medium 804 as first test pattern set 818. Control system 800 is configured to receive information related to a second test pattern set through I/O interface 810. The information is stored in computer readable medium 804 as second test pattern set 820. Control system 800 is configured to receive information related to a primary node list through I/O interface 810. The information is stored in computer readable medium 804 as primary node list 822. Control system 800 is configured to receive information related to a secondary node list through I/O interface 810. The information is stored in computer readable medium 804 as secondary node list 824. Control system 800 is configured to receive information related to a fault list through I/O interface 810. The information is stored in computer readable medium 804 as fault list 826. Control system 800 is configured to receive information related to an extracted fault list through I/O interface 810. The information is stored in computer readable medium 804 as extracted fault list 828. Control system 800 is configured to receive information related to a second fault list through I/O interface 810. The information is stored in computer readable medium 804 as second fault list 830. Control system 800 is configured to receive information related to an EDA Tool through I/O interface 810. The information is stored in computer readable medium 804 as EDA Tool 832. Control system 800 is configured to receive information related to a selection through I/O interface 810. The information is stored in computer readable medium 804 as selection 834. Control system 800 is configured to receive information related to a UI through I/O interface 810. The information is stored in computer readable medium 804 as UI 836.

In some embodiments, the implementation shown in FIGS. 2-8 provides an environment for detecting one or more faults in a semiconductor device. In some embodiments, the second test pattern set includes one or more test patterns based on the secondary node list. In some embodiments, the implementation of method 200, 300, 400, 500, 600 or 700 includes one or more test patterns that detect faults where a large defect density is observed in the semiconductor device when compared with other regions (e.g., lower defect density regions). In some embodiments, the implementation of method 200, 300, 400, 500, 600 or 700 targets regions of the semiconductor device where clustered defects are observed in neighbor nodes. In some embodiments, the implementation of method 200, 300, 400, 500, 600 or 700 includes one or more test patterns based on neighborhood excitation and propagation. In some embodiments, the implementation of method 200, 300, 400, 500, 600 or 700 includes a filtered test pattern set that is correlated to one or more test patterns based on the neighbor nodes contained in each neighbor node list. In some embodiments, the implementation of method 200, 300, 400, 500, 600 or 700 detects faults in a semiconductor device and reduces the test pattern count.

In some embodiments, method 200, 300, 400, 500, 600 or 700 is implemented as a standalone software application for execution by a processor. In some embodiments, method 200, 300, 400, 500, 600 or 700 is implemented as a software application that is a part of an additional software application. In some embodiments, method 200, 300, 400, 500, 600 or 700 is implemented as a plug-in to a software application. In some embodiments, method 200, 300, 400, 500, 600 or 700 is implemented as a software application that is a portion of an EDA tool. In some embodiments, method 200, 300, 400, 500, 600 or 700 is implemented as a software application that is used by an EDA tool. In some embodiments, the EDA tool is used to generate a layout of the semiconductor device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design.

One of ordinary skill in the art would recognize that operations are able to be removed or that additional operations are able to be added to method 200, 300, 400, 500, 600 or 700 without departing from the scope of this description. One of ordinary skill in the art would also recognize that an order of operations in method 200, 300, 400, 500, 600 or 700 is able to be adjusted without departing from the scope of this description.

One aspect of this description relates to method of detecting one or more faults in a semiconductor device. The method includes generating a first test pattern set from a primary node list and a fault list, generating one or more secondary node lists from the primary node list and generating a second test pattern set from at least the first test pattern set and the secondary node list. The primary node list includes one or more nodes and the fault list includes one or more faults. Each node of the one or more nodes of the primary node list is associated with a corresponding secondary node list of the one or more secondary node lists.

Another aspect of this description relates to a system for detecting one or more faults in a semiconductor device. The system comprises at least one processor and at least one memory including computer program code for one or more programs, the at least one memory and the computer program code being configured to, with the at least one processor, cause the system to generate a first test pattern set from a primary node list and a fault list, generate one or more secondary node lists from the primary node list and generate a second test pattern set from at least the first test pattern set and the secondary node list. Furthermore, the primary node list comprises one or more nodes, the fault list comprises one or more faults, the first test pattern set comprises one or more test patterns and each node of the one or more nodes of the primary node list is associated with a corresponding secondary node list of the one or more secondary node lists.

Still another aspect of this description relates to a computer readable medium comprising computer executable instructions for carrying out a method for testing a semiconductor device. The method comprising generating a first test pattern set from a primary node list and a fault list, generating one or more secondary node lists from the primary node list, and generating a second test pattern set from at least the first test pattern set and the secondary node list. Furthermore, the primary node list comprises one or more nodes, the fault list comprises one or more faults, and the first test pattern set comprises one or more test patterns. Also, each node of the one or more nodes of the primary node list is associated with a corresponding secondary node list of the one or more secondary node lists.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of detecting one or more faults in a semiconductor device, the method comprising:
   generating a first test pattern set from a primary node list and a fault list, wherein the primary node list comprises one or more nodes, wherein the fault list identifies the one or more faults;
   generating one or more secondary node lists from the primary node list, wherein each node of the one or more nodes of the primary node list is geometrically associated with a corresponding secondary node list of the one or more secondary node lists; and
   generating a second test pattern set from at least the first test pattern set and the secondary node list.

2. The method of claim 1, wherein each secondary node list of the one or more secondary node lists comprises a selected node from the primary node list and one or more nodes from the primary node list that is within a predetermined distance of each selected node.

3. The method of claim 1, wherein generating one or more secondary node lists comprises:
   selecting a node from the primary node list; and
   adding the selected node or one or more determined nodes of the primary node list within a predetermined distance of the selected node to the secondary node list for the corresponding selected node.

4. The method of claim 1, wherein generating one or more secondary node lists comprises:
   selecting a node from the primary node list;
   determining a physical location of the selected node based on a physical layout of the semiconductor device;
   enclosing the physical location of the selected node with a predetermined drawing shape;
   determining one or more nodes in the primary node list enclosed by the predetermined drawing shape; and
   adding the selected node or one or more determined nodes of the primary node list to the secondary node list for the corresponding selected node when the one or more determined nodes are enclosed by the predetermined drawing shape.

5. The method of claim 1, wherein the first test pattern set comprises one or more test patterns, and wherein each test pattern of the one or more test patterns is arranged to cause the detection of at least one fault from the fault list.

6. The method of claim 1, wherein the second test pattern set is a portion of the first test pattern set.

7. The method of claim 1, wherein each test pattern of the one or more test patterns comprises one or more ordered lists of inputs to the semiconductor device and one or more ordered lists of expected outputs of the semiconductor device, wherein each ordered list of inputs of the one or more ordered lists of inputs corresponds to each ordered list of expected outputs of the one or more ordered lists of expected outputs.

8. A system for detecting one or more faults in a semiconductor device, comprising:
   at least one processor; and
   at least one memory including computer program code for one or more programs, the at least one memory and the computer program code being configured to, with the at least one processor, cause the system to:
   generate a first test pattern set from a primary node list and a fault list, wherein the primary node list comprises one or more nodes, wherein the fault list identifies the one or more faults, wherein the first test pattern set comprises one or more test patterns;
   generate one or more secondary node lists from the primary node list, wherein each node of the one or more nodes of the primary node list is geometrically associated with a corresponding secondary node list of the one or more secondary node lists; and
   generate a second test pattern set from at least the first test pattern set and the secondary node list.

9. The system of claim 8, wherein the computer program code to cause the system to generate one or more secondary node lists comprises computer program code to cause the system to:
   select a node from the primary node list;
   determine a physical location of the selected node based on a physical layout of the semiconductor device;
   enclose the physical location of the selected node with a predetermined drawing shape;
   determine one or more nodes in the primary node list enclosed by the predetermined drawing shape; and
   add the selected node or one or more determined nodes of the primary node list to the secondary node list for the corresponding selected node when the one or more determined nodes are enclosed by the predetermined drawing shape.

10. The system of claim 8, wherein the second test pattern set comprises one or more filtered test patterns, wherein each filtered test pattern of the second test pattern set is arranged to cause the detection of at least one fault from the fault list.

11. The system of claim 8, wherein the computer program code to cause the system to generate the second test pattern set from at least the first test pattern set and the secondary node list comprises computer program code to cause the system to:
   select one or more test patterns from the first test pattern set;
   generate a secondary fault list for each of the selected test patterns and each of the faults in the fault list, wherein the secondary fault list comprises one or more detected faults in the semiconductor device; and
   add the selected test patterns of the one or more test patterns to the second test pattern set, for each of the selected test patterns of the one or more test patterns that affect one or more nodes in the secondary node list for each detected fault in the secondary fault list.

12. The system of claim 11, wherein the computer program code to cause the system to generate the secondary fault list comprises computer program code to cause the system to perform a fault simulation for each of the selected test patterns of the one or more test patterns and each of the faults in the fault list, wherein the fault simulation detects one or more detected faults in the semiconductor device.

13. The system of claim 11, further comprising computer program code to cause the system to determine a state of one or more nodes in the secondary node list for each detected fault in the secondary fault list, wherein each node of the one or more nodes in the secondary node list is associated with a corresponding state.

14. The system of claim 11, further comprising computer program code to cause the system to add the selected test patterns of the one or more test patterns to the second test pattern set, for each of the selected test patterns of the one or more test patterns that change a state of one or more nodes in the secondary node list, wherein each node of the one or more nodes in the secondary node list is associated with a corresponding state.

15. A computer readable medium comprising computer executable instructions for carrying out a method of testing a semiconductor device, the method comprising:
　　generating a first test pattern set from a primary node list and a fault list, wherein the primary node list comprises one or more nodes, wherein the fault list comprises one or more faults, wherein the first test pattern set comprises one or more test patterns;
　　generating one or more secondary node lists from the primary node list, wherein each node of the one or more nodes of the primary node list is geometrically associated with a corresponding secondary node list of the one or more secondary node lists; and
　　generating a second test pattern set from at least the first test pattern set and the secondary node list.

16. The computer readable medium of claim 15, wherein each secondary node list of the one or more secondary node lists comprises a selected node from the primary node list and one or more nodes from the primary node list that is within a predetermined distance of each selected node.

17. The computer readable medium of claim 16, wherein generating a second test pattern set from at least the first test pattern set and the secondary node list comprises:
　　selecting one or more test patterns from the first test pattern set;
　　generating a secondary fault list for each of the selected test patterns and each of the faults in the fault list, wherein the secondary fault list comprises one or more detected faults in the semiconductor device; and
　　adding the selected test patterns of the one or more test patterns to the second test pattern set, for each of the selected test patterns of the one or more test patterns affecting one or more nodes in the secondary node list for each detected fault in the secondary fault list.

18. The computer readable medium of claim 17, wherein generating the secondary fault list comprises performing a fault simulation for each of the selected test patterns of the one or more test patterns and each of the faults in the fault list, wherein the fault simulation detects one or more detected faults in the semiconductor device.

19. The computer readable medium of claim 17, further comprising determining a state of one or more nodes in the secondary node list for each detected fault in the secondary fault list, wherein each node of the one or more nodes in the secondary node list is associated with a corresponding state.

20. The computer readable medium of claim 17, wherein affecting one or more nodes in the secondary node list comprises changing a state of one or more nodes in the secondary node list, wherein each node of the one or more nodes in the secondary node list is associated with a corresponding state.

* * * * *